(12) United States Patent
Gumm

(10) Patent No.: US 6,437,578 B1
(45) Date of Patent: Aug. 20, 2002

(54) CABLE LOSS CORRECTION OF DISTANCE TO FAULT AND TIME DOMAIN REFLECTOMETER MEASUREMENTS

(75) Inventor: Linley F. Gumm, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 9 days.

(21) Appl. No.: 09/712,027

(22) Filed: Nov. 14, 2000

(51) Int. Cl.[7] .............................................. G01R 31/11
(52) U.S. Cl. ..................................................... 324/533
(58) Field of Search ................................ 324/520, 527, 324/533, 534, 600, 605, 616, 617, 637, 638, 650; 702/60, 77; 375/257; 340/870.13; 385/24; 370/501; 379/21, 22.03, 24, 27.03

(56) References Cited

U.S. PATENT DOCUMENTS

| | | | | |
|---|---|---|---|---|
| 4,630,228 A | * | 12/1986 | Tarczy-Hornoch | .......... 364/576 |
| 5,633,801 A | * | 5/1997 | Bottman | .................... 364/482 |
| 6,125,103 A | * | 9/2000 | Bauml et al. | ................ 370/203 |

* cited by examiner

*Primary Examiner*—N. Le
*Assistant Examiner*—Etienne P LeRoux
(74) *Attorney, Agent, or Firm*—Francis I. Gray

(57) ABSTRACT

Cable loss correction of distance to fault (DTF) and time domain reflectometer (TDR) measurements obtains distances to impulses representing reflections from a cable under test from a time domain representation of the cable. For each impulse a plurality of frequency data are generated and amplitude corrected based upon the cable loss at the given distance to the impulse. The resulting frequency data are then converted back to the time domain to present a time domain representation of a corresponding lossless cable showing the impulses at appropriate amplitudes. The impulses representing the reflections from the cable may be obtained by a vector network analyzer that obtains amplitude and phase data for a plurality of test signal frequencies, which data is then converted to the time domain to show the impulses and the distances of the impulses from the measurement end of the cable.

2 Claims, 2 Drawing Sheets

CABLE LOSS CORRECTION OF DISTANCE TO FAULT AND TIME DOMAIN REFLECTOMETER MEASUREMENTS

BACKGROUND OF THE INVENTION

The present invention relates to cable fault measurements, and more particularly to a method of cable loss correction of distance to fault (DTF) and of time domain reflectometer (TDR) measurements.

To explore the characteristics of a DTF measurement system an idealized impulse response is considered. Referring now to FIG. 1 a return loss bridge is coupled to a length of cable. The cable is open-circuited at the far end, giving a reflection coefficient $\Gamma=1$ at distance d. If the cable's loss is neglected, the system's impulse response and its Fourier transform may be written virtually by inspection. The impulse enters the cable via the return loss bridge and travels distance, d, to the end where it is reflected with a reflection coefficient, $\Gamma$. The impulse travels back along the cable and is routed to a measurement receiver by the return loss bridge. The system's impulse response is simply $\Gamma(t)$ convolved with a delay corresponding to $2d$, i.e., $$g(\delta)=\Gamma(t)*\delta(t-2d/(v_{rel}c))$$

where $\Gamma(t)$ is the reflection coefficient the signal sees at the end of the cable, d is the length of the cable, $v_{rel}$ is the relative velocity of the signal in the cable with respect to the speed of light, and c is the speed of light.

The Fourier transform of $g(\delta)$ is straight forward. $\Gamma(t)$ transforms to $\Gamma(f)$, the convolution, $\Gamma*\delta$, transforms to a product, the impulse, $\delta(t)$, transforms to a unity value and the delay operator, $-2d/(v_{rel}c)$, in the impulse's argument transforms to an exponential that causes a phase change with frequency:

$$G(f)=\Gamma(f)e^{\alpha f} \text{ where } \alpha=-j(4\pi d/v_{rel}c).$$

But the cable is lossy. The function $G(f)$ needs to be modified to account for the loss by adding the loss term associated with the two way travel in the cable:

$$G(f)=\Gamma(f)L(d,f)e^{\alpha}$$

To this point a cable system with only one reflection has been assumed. In actual measurements most cable systems have multiple sources of reflections. Treating each return arriving at the input terminals as a real signal regardless of whether it is real or is caused by the reflection of a reflection:

$$g(\delta)=\Sigma_n\Gamma_n(t)*\delta(t-2d/v_{rel}c), G(f)=\Sigma_n\Gamma_n(f)e^{\alpha'f} \text{ and } G(f)=\Sigma_n\Gamma_n(f)L(d_n,f)e^{\alpha'}$$

where $\alpha'=-j(4\pi d_n/v_{rel}c)$

This corresponds to the actual data created in a DTF measurement. This data is then windowed and passed through an inverse Fourier transform to determine the cable's impulse response:

$$g(t)=\mathfrak{I}^{-1}(G(f))$$

The inverse Fourier transform determines the distance of the various responses $G(f)$ by grouping all portions of the signal together that have the same rate of change of phase as a function of frequency.

For the cable shown in FIG. 2 assume that $G(f)$ has been determined by making measurements at every $\Delta F$ in frequency, where $\Delta F$ is 1.5 MHz, over a range of frequencies from Fstart to Fstop (25–3000 MHz) using an idealized, zero-loss cable. After the data is measured, it is windowed and then transformed into the time domain using a Fourier transformation. The result is shown in FIG. 3. The resistor between the two line sections and an open or short circuit at the end of the second section gives a theoretical response of two equal return loss responses, one at d1 and the other at d2. However, the actual result is different as the cable has loss. The sine wave test signal of a DTF process travels much further to the far end of the cable than to the resistor. Further where a low frequency test signal is used, the loss at either distance is fairly low. When a frequency near its upper end is used, the loss to the cable's distant end is much greater than that from the resistor. The approximate result Is shown in FIG. 4 where d2's response is smaller than the one from d1. Due to the smaller amplitude of the response at d2, the reflection may not be deemed to be significant.

The data in FIG. 4 is computed as a discrete signal, i.e., it is a vector or list of values, each defined as the arithmetic, complex value of the reflection, $\Gamma_d$, at a distance d. $\Gamma_d$ is the cable system's impulse response for whatever discontinuity is present at distance d, so the measured frequency response of this point alone is:

$$Gm(f)=\Gamma_d e^{\alpha f}$$

The frequency response of the entire DTF response may then be written as the summation of the effects of each point in turn:

$$Gm(f)=\Sigma_d\Gamma_d e^{\alpha f}.$$

What is desired is a method of performing cable loss correction of distance to fault and of time domain reflectometry measurements so that DTF data is presented in the form of a lossless cable.

BRIEF SUMMARY OF THE INVENTION

Accordingly the present invention provides a cable loss correction of distance to fault and time domain reflectometry measurements by inserting a loss compensation factor, Lc, into the initial distance to fault calculation. Data acquired in the frequency domain is Fourier transformed to the time domain to provide an impulse response for the cable. For each distance, d, in the time domain an inverse Fourier transform to the frequency domain is performed while correcting each point based on the distance and frequency for that point. The corrected data is then Fourier transformed back to the time domain to present an impulse response for a lossless cable so that the significance of discontinuities may be readily observed.

The objects, advantages and other novel features of the present invention are apparent from the following detailed description when read in light of the appended claims and drawing.

DETAILED DESCRIPTION OF THE INVENTION

Loss in dB of a coaxial cable is directly proportional to the cable's length and very nearly proportional to the square root of the frequency of the signal passing through it. For example 100 meters of a coaxial cable has a 6 dB loss at 1000 MHz. If only 50 meters of cable is used, the loss is only 3 dB. If the signal frequency is lowered to 250 MHz, the loss only falls to 3 dB, i.e., sqrt$\{250/1000\}$=1/2. Using these facts the relationship for the arithmetic loss of the cable is: $L(f,d)=10^\epsilon$ where $\epsilon=(L_{1G}\sqrt{(f/10^9)}*(d/100))/20=L_{1G}\sqrt{(f/10^9)}*d/2000$, $L_{1G}$ is the cable's loss in dB/100 meters at 1000 MHz, f is the frequency in Hz and d is the cable length in meters. An inverse function to compensate for the cable's loss is constructed by negating the exponential term: $Lc(f,d)=10^{-\epsilon}$.

The frequency response of a distance to fault (DTF) response for multiple discontinuities in a cable, as discussed above, is given by $Gm(f)=\Sigma_d \int_d e^{\alpha f}$. This function includes the effects caused by the cable's loss. To correct for this effect the loss compensation function, Lc, is inserted to produce $$Gc(f)=Gm(f)=\Sigma_d \int_d L_c(d,f)e^{-j\alpha f}.$$

By processing the $\int_d$ values from the initial DTF calculation through this function, the equivalent frequency response values for a lossless cable are found. This calculation may be lengthy. Since Lc(d,f) is a function of both distance and frequency, each term of the summation is individually calculated instead of using a Fourier transform. The number of calculations increases as the square of the number of data points. For instance a record of 2048 points requires 4.2 million multiplications and additions.

Figure 1:
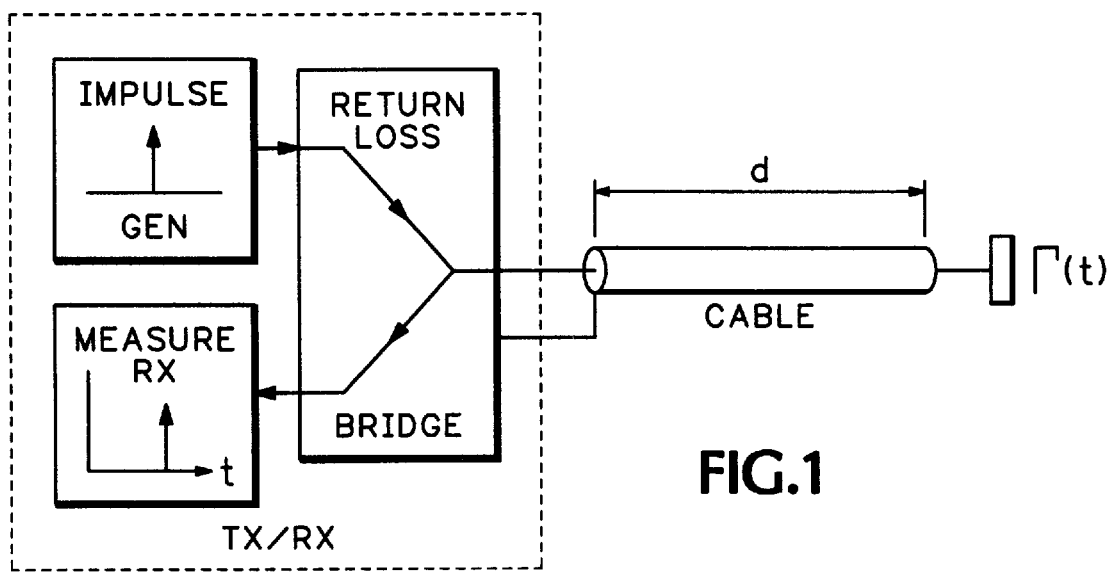
FIG. 1 is block diagram view of a typical test system for a cable system with a single reflection.
Figure 2:
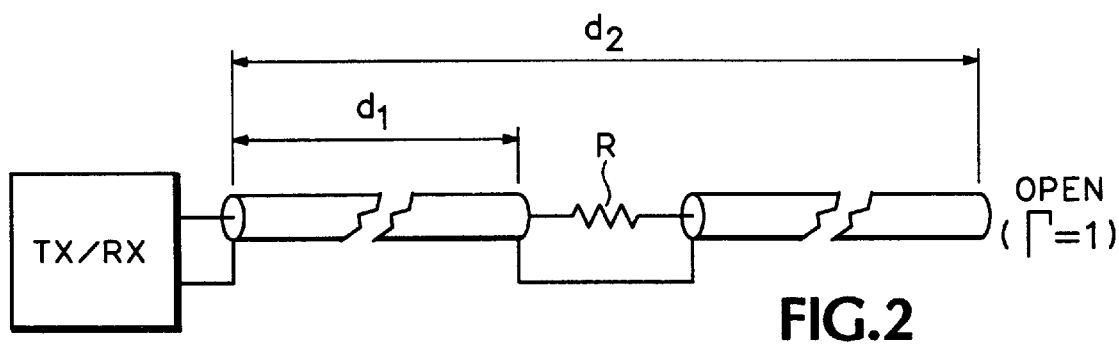
FIG. 2 is a block diagram view of a typical test system for a cable system with more than a single reflection.
Figure 3:
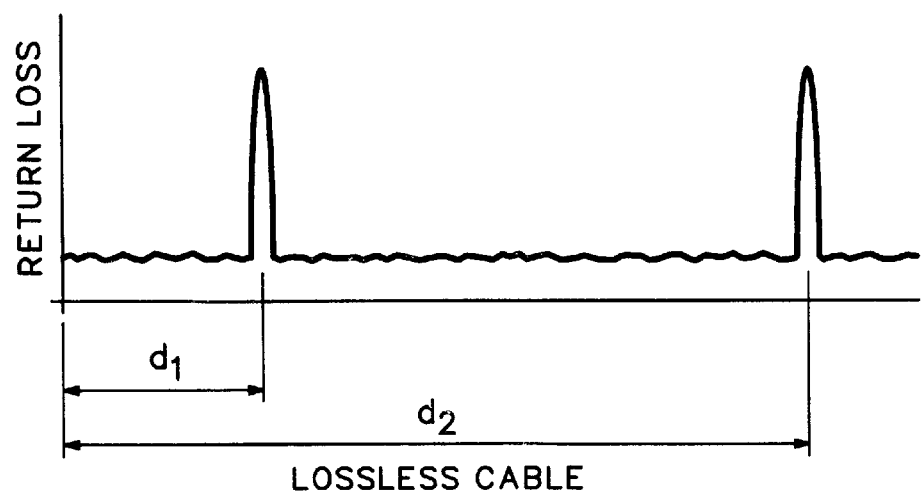
FIG. 3 is a graphic diagram view of reflections on a lossless cable.
Figure 4:
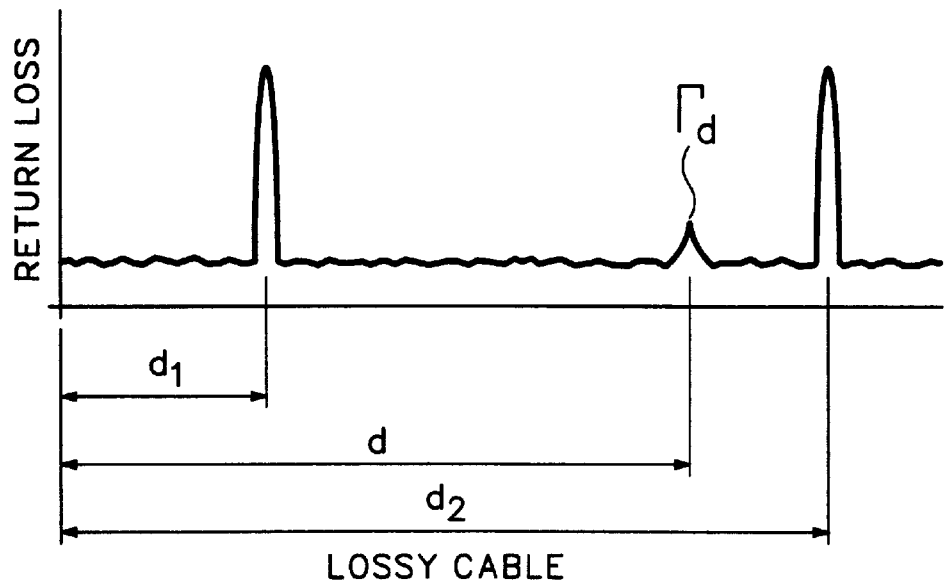
FIG. 4 is a graphic diagram view of reflections on a lossy cable.
Figure 5:
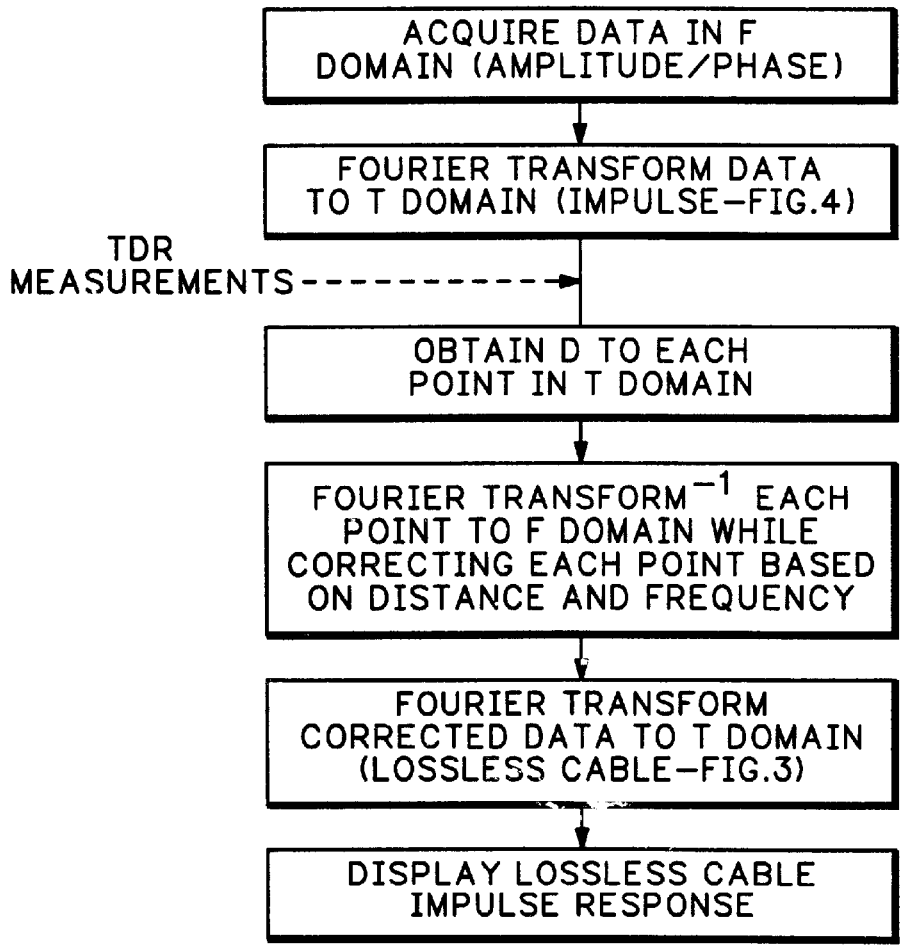
FIG. 5 is a flow chart diagram view of the cable loss correction method according to the present invention.

Referring now to FIG. 5 data is initially acquired in the frequency domain as a series of amplitudes and phases for each frequency generated by the measurement instrument. This data is then processed by a Fourier transform to convert the data to the time domain, as shown in FIG. 4. From the time domain the distance, d, to impulses may be obtained. Then the data for each impulse at each measurement frequency is processed by converting back to the frequency domain using an inverse Fourier transform, such as an inverse discrete Fourier transform (DFT), and the amplitude for each frequency is amplitude corrected by the cable loss for that d at the frequency being computed for that instant. For example if at frequency, $f_n$, there is a specified amplitude, A, and phase, $\theta$, and the cable loss at distance d and frequency,$f_n$, is $L(f_n,d)$, then the amplitude data for $f_n$ is modified by $A/L(f_n,d)$. Once the data has been corrected for cable loss at each frequency data point, $f_n$, for each impulse, d, then a Fourier transform is performed to provide a time domain representation corresponding to a lossless cable, as shown in FIG. 3. This representation is displayed so that an operator can see that the reflection at distance d2, for example, is in fact significant.

As indicated above, once the corrected frequency domain is calculated, the time domain is obtained by taking the Fourier transform of Gc(f) and once again viewing the data in the distance domain. However this and the first Fourier transformation may be computed using an FFT that minimizes the time required for computation. This process is also applicable to time domain reflectometer (TDR) measurements, where the TDR measurement is in the time domain initially. When directly measured with an impulse type TDR, the initial measurement process yields the results shown in FIG. 4. This measurement may be used instead of the data derived from the DTF measurement in the correction algorithm. If a step type of TDR is used, the impulse response is derived from the return data before this form of a correction algorithm is performed.

The source of the initial time domain impulse response reflection measurement used to compute this correction is immaterial. There just needs to be sufficient data points in the record to avoid effects caused by aliasing.

Thus the present invention provides for cable loss correction of DTF and TDR measurements by obtaining distance to events or impulses from the time domain, converting to the frequency domain on a term by term basis correcting each term for cable loss at that distance and frequency, and then converting back to the time domain to present a display corresponding to a lossless cable.

What is claimed is:

1. A method of cable loss correction comprising the steps of:

generating from measurement data a time domain representation of a cable as a series of impulse responses, each impulse response having a distance from a measurement end of the cable;

converting each impulse response into a plurality of frequency values, each frequency value having an amplitude and a phase;

correcting the amplitude of each frequency value as a function of cable loss, where cable loss is a function of frequency and distance; and converting the frequency values into the time domain to provide a time domain representation of a corresponding lossless cable.

2. The method as recited in claim 1 wherein the generating step comprises:

acquiring the measurement data for each of a plurality of frequencies, the measurement data representing amplitude and phase of reflections from the cable; and converting the measurement data to the time domain as the representation of the cable.

* * * * *